United States Patent
Alameldeen et al.

(10) Patent No.: US 12,093,573 B2
(45) Date of Patent: Sep. 17, 2024

(54) LOW-COMPLEXITY COVERAGE-BASED COMPRESSION

(71) Applicant: Intel Corporation, Santa Clara, CA (US)

(72) Inventors: Alaa Alameldeen, Hillsboro, OR (US); Amir Ali Radjai, Portland, OR (US); Jason Van Dyken, Portland, OR (US); Aditya Nagaraja, Hillsboro, OR (US); Joshua Underdown, Hillsboro, OR (US); James Greensky, Portland, OR (US); Wei Wu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 639 days.

(21) Appl. No.: 17/163,179

(22) Filed: Jan. 29, 2021

(65) Prior Publication Data
US 2021/0255808 A1    Aug. 19, 2021

(51) Int. Cl.
*G06F 3/06* (2006.01)
*G06F 11/10* (2006.01)
*H03M 7/30* (2006.01)

(52) U.S. Cl.
CPC .......... *G06F 3/0661* (2013.01); *G06F 3/0608* (2013.01); *G06F 3/0673* (2013.01); *G06F 11/1076* (2013.01); *H03M 7/30* (2013.01)

(58) Field of Classification Search
CPC .... G06F 3/0661; G06F 3/0608; G06F 3/0673; G06F 11/1076; H03M 7/30
See application file for complete search history.

(56) References Cited

U.S. PATENT DOCUMENTS

| | | | |
|---|---|---|---|
| 2005/0078399 A1* | 4/2005 | Fung | G11B 20/00007 |
| 2019/0332469 A1 | 10/2019 | Radjai et al. | |
| 2021/0200771 A1* | 7/2021 | Kuang | G06F 16/27 |
| 2024/0028510 A1* | 1/2024 | Arelakis | H03M 7/40 |

OTHER PUBLICATIONS

Kim, J. et al., "Frugal ECC: Efficient and Versatile Memory Error Protection through Fine-Grained Compression", SuperComputing (SC '15), Nov. 15-20, 2015, Austin, TX, USA, 12 pgs.
Pekhimenko, G. et al., "Base-Delta-Immediate Compression: Practical Data Compression for On-Chip Caches", Proceedings of the 21st International Conference on Parallel Architectures and Compilation Techniquest (PACT'12), Sep. 2012, pp. 377-388.

* cited by examiner

*Primary Examiner* — Edward J Dudek, Jr.
(74) *Attorney, Agent, or Firm* — Essential Patents Group, LLP

(57) ABSTRACT

An embodiment of an electronic apparatus may include a substrate, and logic coupled to the substrate, the logic to determine a base value to compress a block of data, wherein the block of data consists of a first number of data words, replace original values from a second number of data words from the block of data with respective delta values from the base value to provide compressed data, wherein the second number of data words is at least two less than the first number of data words, and store metadata associated with the block of data together with the compressed data in the block of data. Other embodiments are disclosed and claimed.

20 Claims, 8 Drawing Sheets

| CCC | F | IS | I1 | I2 | D1 | D2 | ECC | W0 | ... | W13 |

C:   1-bit flag x 3
F:   1-bit flag (zero or selected)
IS:  4-bit index to position of selected base value
I1:  4-bit index to position of replaced data word one
I2:  4-bit index to position of replaced data word two
D1:  3-bit delta value for replaced data word one
D2:  3-bit delta value for replaced data word two
ECC: 10-bit SECDED ECC
W0:  Remaining (non-compressed) data word zero
...      <14 words total>
W13: Remaining (non-compressed) data word thirteen

| CCC | F | IS | I1 | I2 | D1 | D2 | ECC | W0 | ... | W13 |

C: 1-bit flag x 3
F: 1-bit flag (zero or selected)
IS: 4-bit index to position of selected base value
I1: 4-bit index to position of replaced data word one
I2: 4-bit index to position of replaced data word two
D1: 3-bit delta value for replaced data word one
D2: 3-bit delta value for replaced data word two
ECC: 10-bit SECDED ECC
W0: Remaining (non-compressed) data word zero
... <14 words total>
W13: Remaining (non-compressed) data word thirteen

FIG. 5

| CCC | ECC | F | IA | I1 | I2 | D1 | D2 | W0 | ... | W13 |

C: 1-bit flag x 3
ECC: 11-bit SECDED ECC
F: 1-bit flag (zero or arbitrary)
IA: 1-bit flag indicating which of two arbitrary positions to use for the base value
I1: 4-bit index to position of replaced data word one
I2: 4-bit index to position of replaced data word two
D1: 4-bit delta value for replaced data word one
D2: 4-bit delta value for replaced data word two
W0: Remaining (non-compressed) data word zero
... <14 words total>
W13: Remaining (non-compressed) data word thirteen

FIG. 6

LOW-COMPLEXITY COVERAGE-BASED COMPRESSION

BACKGROUND

Error-correcting code (ECC) memory is a type of computer data storage that detects and corrects many types of internal data corruption. Typically, an ECC memory maintains a memory system immune to one or multiple bits of errors. In ECC memory the data that is read from each word is the same as the data that had been written to it, even if one or more of the bits actually stored in the ECC memory has been flipped to the wrong state. Syndrome tables are a mathematical way of identifying bit errors and then correcting the bit errors, and syndrome spaces may be used in such syndrome based decoding.

ECC memory is used to provide reliability for applications that cannot tolerate data corruption. ECC memory may be comprised of an extra device on a dual in-line memory module (DIMM) which provides the additional ECC storage, as well as data lane so that ECC information is written and read along with the data. For example, on a DDR4 with x8 devices, an ECC DIMM may be comprised of 9 such devices to form a 72 bit channel, where 64 bits are used to transfer the data and 8 bits are used for ECC data transfer. Data may be protected with Single Error Correction and Double Error Detection (SECDED) with 8 bits for every 64 bits of data transfer. ECC DIMMS are typically more expensive than regular DIMMs.

Base-Delta-Immediate (BDI) compression refers to a technique for compressing data in on-chip caches. BDI represents a cache line using a base value and an array of differences whose combined size is smaller than the original cache line. Where a cache line intersperses such base+delta values with small values, BDI efficiently incorporates such immediate values into the encoding.

Frugal ECC (FECC) compresses main memory at cache-block granularity, using the saved space to store ECC information. FECC utilizes coverage-oriented compression to trade off compression ratio for compression coverage. FECC utilizes BDI compression for homogeneously-typed data, exponent compression for floating-point data, and frequent word pattern compression for heterogeneously-typed data.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 5 is a block diagram of an example of a compressed block according to an embodiment;

FIG. 6 is a block diagram of another example of a compressed block according to an embodiment;

DETAILED DESCRIPTION

Figure 1:
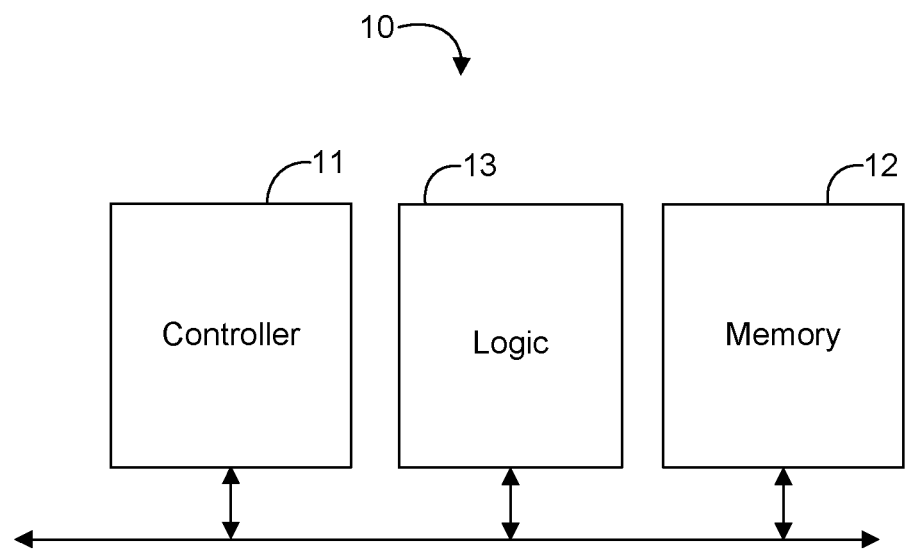
FIG. 1 is a block diagram of an example of an electronic memory system according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; flash memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

With reference to FIG. 1, an embodiment of an electronic memory system 10 may include a controller 11, memory 12 to store a block of data that consists of a first number of data words, and logic 13 communicatively coupled to the controller 11 and the memory 12. The logic 13 may be configured to determine a base value to compress the block of data, replace original values from a second number of data words from the block of data with respective delta values from the base value to provide compressed data, where the second number of data words is at least two less than the first number of data words, and store metadata associated with the block of data together with the compressed data in the block of data. In some embodiments, the logic 13 may be further configured to set one or more data index fields in the metadata to indicate respective positions of data words of the block of data that are replaced with the respective delta values from the base value.

In some embodiments, the logic 13 may be further configured to identify a data word from the block of data with a data value that is suitable for the base value, and set the base value to the data value of the identified data word. For example, the logic 13 may also be configured to set a base index field in the metadata to indicate a position of the identified data word. Alternatively, or additionally, the logic 13 may be configured to set the base value to a data value at a fixed data word position, and to set a field in the metadata to indicate if the base value is zero or the data value at the fixed data word position. For example, the metadata may include error correction code (ECC) information.

Embodiments of each of the above controller 11, memory 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a microcontroller, a general purpose processor, a special purpose processor, a central processor unit (CPU), an execution unit, etc. In some embodiments, the memory 12, the logic 13, and/or other system memory may be located in, or co-located with, various components, including the controller 11 (e.g., on a same die).

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the memory 12, persistent storage media, or other system memory may store a set of instructions which when executed by the controller 11 cause the system 10 to implement one or more components, features, or aspects of the system 10 (e.g., the logic 13, determining the base value to compress the block of data, replacing original values from the block of data with delta values from the base value to provide compressed data, storing the metadata associated with the block of data together with the compressed data in the block of data, etc.).

Figure 2:
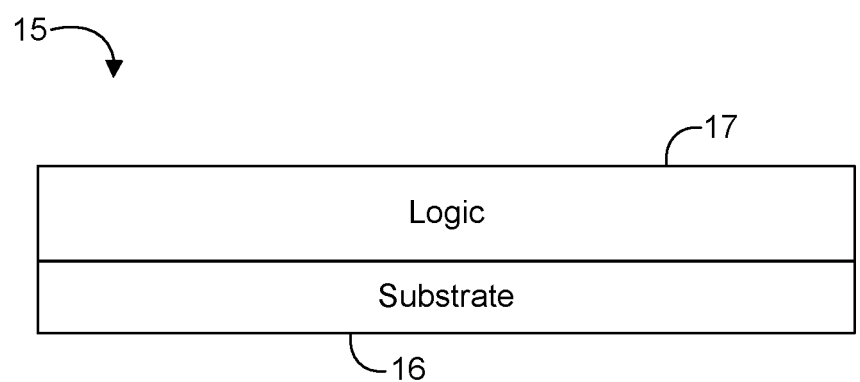
FIG. 2 is a block diagram of an example of an electronic apparatus according to an embodiment.

Turning now to FIG. 2, an embodiment of an electronic apparatus 15 may include a substrate 16 and logic 17 coupled to the substrate 16. The logic 17 may be configured to determine a base value to compress a block of data (where the block of data consists of a first number of data words), replace original values from a second number of data words from the block of data with respective delta values from the base value to provide compressed data (where the second number of data words is at least two less than the first number of data words), and store metadata associated with the block of data together with the compressed data in the block of data. In some embodiments, the logic 17 may be further configured to set one or more data index fields in the metadata to indicate respective positions of data words of the block of data that are replaced with the respective delta values from the base value.

In some embodiments, the logic 17 may be further configured to identify a data word from the block of data with a data value that is suitable for the base value, and set the base value to the data value of the identified data word. For example, the logic 17 may also be configured to set a base index field in the metadata to indicate a position of the identified data word. Alternatively, or additionally, the logic 17 may be configured to set the base value to a data value at a fixed data word position, and to set a field in the metadata to indicate if the base value is zero or the data value at the fixed data word position. For example, the metadata may include ECC information.

Embodiments of the logic 17 may be implemented in a system, apparatus, computer, device, etc., for example, such as those described herein. More particularly, hardware implementations of the logic 17 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 17 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the logic 17 may be implemented on a semiconductor apparatus, which may include the one or more substrates 16, with the logic 17 coupled to the one or more substrates 16. In some embodiments, the logic 17 may be at least partly implemented in one or more of configurable logic and fixed-functionality hardware logic on semiconductor substrate(s) (e.g., silicon, sapphire, gallium-arsenide, etc.). For example, the logic 17 may include a transistor array and/or other integrated circuit components coupled to the substrate(s) 16 with transistor channel regions that are positioned within the substrate(s) 16. The interface between the logic 17 and the substrate(s) 16 may not be an abrupt junction. The logic 17 may also be considered to include an epitaxial layer that is grown on an initial wafer of the substrate(s) 16.

Figure 3:
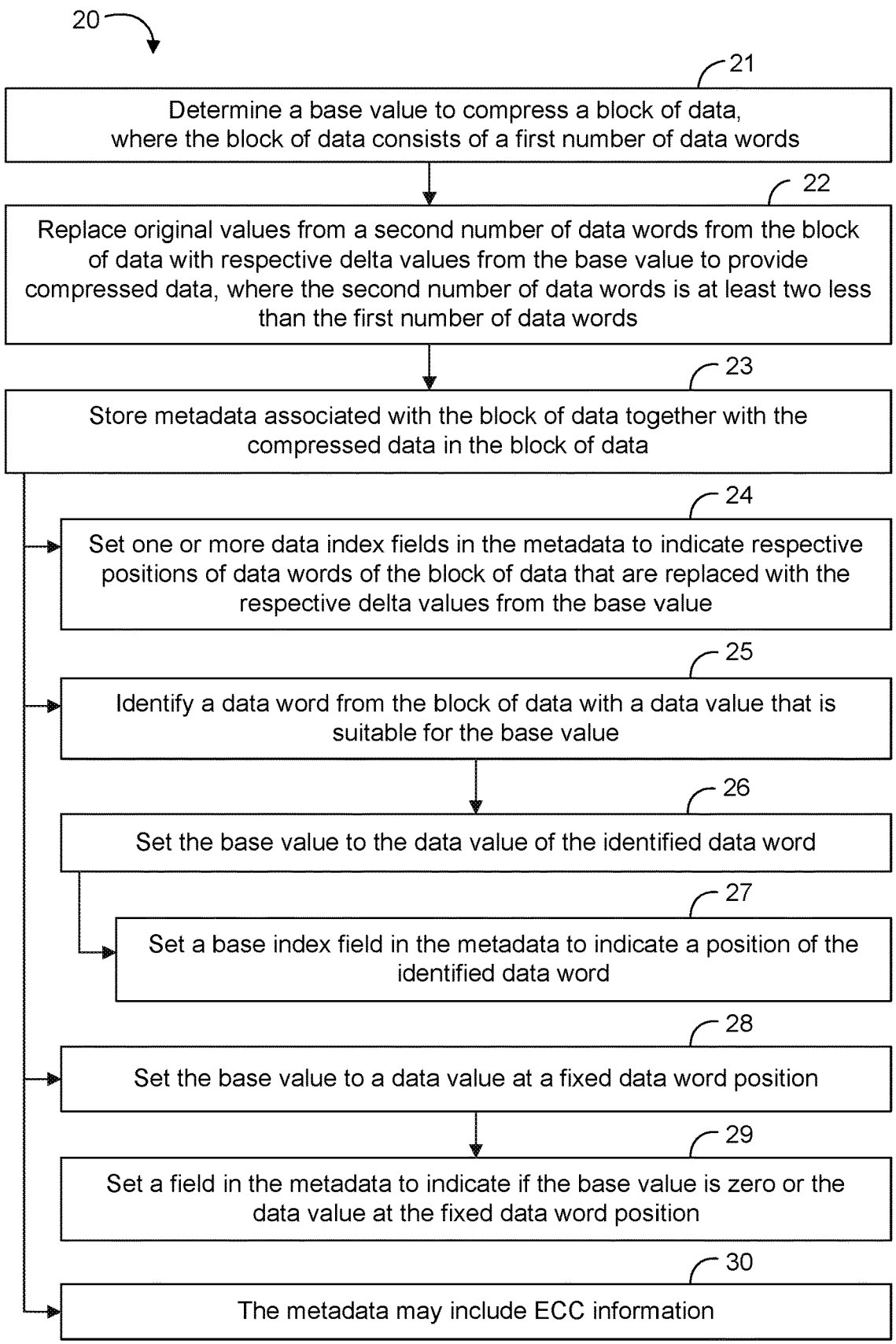
FIG. 3 is a flowchart of an example of a method of compressing memory according to an embodiment.

Turning now to FIG. 3, an embodiment of a method 20 of compressing memory may include determining a base value to compress a block of data, where the block of data consists of a first number of data words, at box 21, replacing original values from a second number of data words from the block of data with respective delta values from the base value to provide compressed data, where the second number of data words is at least two less than the first number of data words, at box 22, and storing metadata associated with the block of data together with the compressed data in the block of data at box 23. Some embodiments of the method may further include setting one or more data index fields in the metadata to indicate respective positions of data words of the block of data that are replaced with the respective delta values from the base value at box 24.

In some embodiments, the method 20 may further include identifying a data word from the block of data with a data value that is suitable for the base value at box 25, and setting the base value to the data value of the identified data word at box 26. For example, the method 20 may also include setting a base index field in the metadata to indicate a position of the identified data word at box 27. Alternatively, or additionally, embodiments of the method 20 may include setting the base value to a data value at a fixed data word position at box 28, and setting a field in the metadata to indicate if the base value is zero or the data value at the fixed data word position at box 29. For example, the metadata may include ECC information at box 30.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Hybrid hardware implementations include static dynamic SoC re-configurable devices such that control flow, and data paths implement logic for the functionality. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the method 20 may be implemented on a computer readable medium. Embodiments or portions of the method 20 may be implemented in firmware, applications (e.g., through an application programming interface (API)), or driver software running on an operating system (OS). Additionally, logic instructions might include assembler instructions, instruction set architecture (ISA) instructions, data set architecture (DSA) commands, (machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, Moore Machine, Mealy Machine, etc.).

Figure 4:
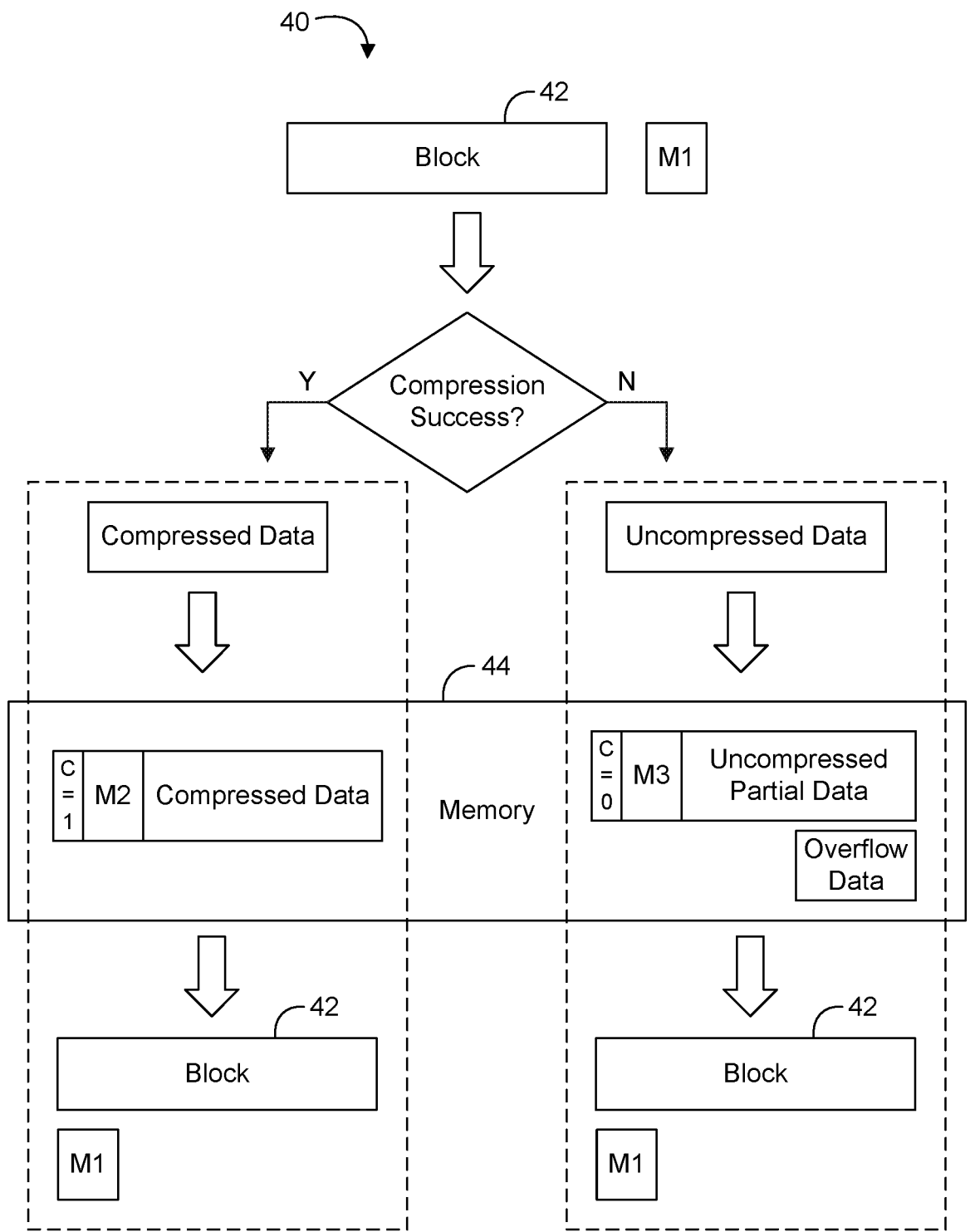
FIG. 4 is a block diagram of an example of a process flow according to an embodiment.

With reference to FIG. 4, an embodiment of a process flow 40 for compressing memory may start with a block of data 42 and metadata M1 associated with the block of data 44. Upon a write request for the block of data 42, the process flow 40 includes compressing the data as described herein to store both the compressed data and the metadata M1 in the same space used for the uncompressed block of data 42. If the compression is successful, the compressed data is combined with a compression flag set to one (C=1, to indicate the successful compression) and metadata M2 (which includes compression metadata and the metadata M1). The successfully compressed block is then written to memory 44 (e.g., a DIMM). If the compression is not successful, the uncompressed data is split into uncompressed partial data that is combined with a compression flag set to zero (C=0, to indicate the unsuccessful compression) and metadata M3. The uncompressed block is then written to the memory 44 and a second write is needed for the remainder of the uncompressed data as overflow data. The metadata M1 may be included with either the metadata M3 or the overflow data. Upon a read request, the block of data 42 is reconstructed from either the compressed block (e.g., with appropriate decompression) or the uncompressed block (e.g., by re-assembling the uncompressed data) and the metadata M1 is retrieved. Advantageously, when the compression is successful, only one read of the memory 44 is needed to retrieve both the block of data 42 and the metadata M1. Moreover, there is little or no penalty involved when the compression is unsuccessful because conventionally two memory reads were already required to retrieve both the block of data 42 and the metadata M1.

Some embodiments may provide technology for low-complexity coverage-based compression. Storing metadata associated with every memory block requires potentially using two memory accesses for every memory request. As an example, to reduce memory errors, an ECC may be stored with every 64 byte (B) or 32B block in memory. Reading a memory block requires reading both the data and ECC, which means every last level cache (LLC) miss may need two memory references, which increases memory bandwidth usage and power. Frugal ECC (FECC) provides support for ECC using fine-grained compression to save enough space for ECC information, but the compression algorithm implementation is complex because it utilizes multiple complex algorithms with high latency and significant power consumption in the compression/decompression logic. One of the algorithms utilized by FECC is the BDI algorithm, which involves calculating a delta value for every word other than the base word in the memory block which increases computation and power consumption. Advantageously, embodiments overcome one or more of the foregoing problems.

Embodiments provide technology to target compressing ECC with data in a single block (e.g., 64B or 32B, depending on ECC granularity) to save memory bandwidth and power. Successful compression stores both compressed data and ECC (e.g., and/or other metadata) in the same space used for an uncompressed block. Some embodiments may utilize a class of compression algorithms (e.g., delta compression from select arbitrary bases) to increase coverage without increasing complexity. Advantageously, some embodiments may save bandwidth and power in systems that use ECC to recover from memory errors. For example, embodiments may be applied to client, server, high performance computing (HPC) systems, etc. that use commodity (non-ECC) DIMMS but still need to support reliability.

Some embodiments may utilize a class of compression algorithms, delta-compression with select arbitrary bases, that provide both high coverage and lower complexity than conventional techniques. Delta compression, in general, identifies one or more words in the memory block that are similar (e.g., within a small delta) to a base word. The base word could be the value zero, an identified word in the block (e.g., that provides successful compression), the first word in the block, or another arbitrary word in the block. A word has a fixed length, e.g., 16 bits (b), 32b, 64b, etc. In various implementations, the terms "block" or "block of data" may refer to or be interchanged with "line" or "cacheline" or "line of data." Embodiments remove one or more words from a block and include compression metadata to indicate where the removed words were in the uncompressed block. Embodiments of a successful compression correspond to when enough bits are removed to be able to reuse the removed bits to store metadata (e.g., ECC) and any other compression related metadata.

With reference to FIG. 5, an embodiment of a compressed block 50 utilizes compression technology to remove two (2) 16-bit words that are within a 3-bit delta from a selected 16-bit word in a 32B block. Compression metadata for the compressed block includes a compressed flag field C (1-bit flag×3), a base flag field F (1-bit flag to indicate a zero base or a selected base), a base index field IS (4-bit index to position of selected base value), a first data index field I1 (4-bit index to position of replaced data word one), a second data index field I2 (4-bit index to position of replaced data word two), a first delta field D1 (3-bit delta value for replaced data word one), a second delta field D2 (3-bit delta value for replaced data word two), a metadata field ECC (10-bit Single Error Correction and Double Error Detection (SECDED) ECC), and fourteen (14) data word fields W0 ... W13 for the remaining (non-compressed) 16-bit data words. When the compression is successful, all of the compression metadata and the ECC metadata occupy the 32 bits of the two removed 16-bit data words.

As shown in FIG. 5, a 1-bit flag F indicates whether the deltas are measured from zero or a selected data word. The three index fields, each 4-bits, point to the selected word index (IS) as well as the two indexes (I1, I2) of the two removed words. The two 3-bit delta fields D1, D2 store the arithmetic difference between each of the two removed words and either zero or the selected word. Three bits are used for the compressed flag field, using triple modular redundancy (TMR) because an error in the compressed flag field is not covered by ECC. The remaining 10 bits of the removed 32 bits store a 10-bit SECDED ECC field that covers 32B of data. The remainder of the compressed block stores the 14 words that haven't been removed.

Any suitable technique may be utilized to identify a suitable base value for the compression. For example, some embodiments may start with zero (0) for the base value and determine if two of the other words are within a 3-bit delta of zero. If so, the compressed flag C is set to 7 (binary 111), the flag F is set to zero to indicate a base value of zero, I1 is set to the position of the first data word within the 3-bit delta of zero, I2 is set to the position of the second data word within the 3-bit delta of zero, and the delta fields D1 and D2 are set to the respective delta values. Otherwise, some embodiments may start with W0 and determine if two of the other words are within a 3-bit delta of W0. If so, the compressed flag C is set to 7 (binary 111), the flag F is set to one to indicate a selected base value, IS is set to 0 (the data word position of W0), I1 is set to the position of the first data word within the 3-bit delta of W0, I2 is set to the position of the second data word within the 3-bit delta of W0, and the delta fields D1 and D2 are set to the respective delta values. If less than two words are within a 3-bit delta of W0, the process may repeat for data words W1 through W15, stopping when a suitable base value is identified. Those skilled in the art will appreciate that all or portions of the foregoing process may be implemented with a state machine or combinatorial logic. If a suitable base value is identified, the ECC information for the block is stored in the ECC field. If no suitable base value is identified, the compression flag field may be set to 0, indicating that the compression was unsuccessful and the overflow data may be stored separately from the uncompressed block.

With reference to FIG. 6, an embodiment of a compressed block 60 utilizes compression technology to remove two (2) 16-bit words that are within a 4-bit delta from one or more arbitrary 16-bit words at fixed positions in a 32B block. Compression metadata for the compressed block includes a compressed flag field C (1-bit flag×3), a metadata field ECC (11-bit SECDED ECC), a base flag field F (1-bit flag to indicate a zero base or an arbitrary base), a base index field IA (1-bit flag to indicate which of two arbitrary positions to use for the base value), a first data index field I1 (4-bit index to position of replaced data word one), a second data index field I2 (4-bit index to position of replaced data word two), a first delta field D1 (4-bit delta value for replaced data word one), a second delta field D2 (4-bit delta value for replaced data word two), and fourteen (14) data word fields W0 . . . W13 for the remaining (non-compressed) 16-bit data words. When the compression is successful, all of the compression metadata and the ECC metadata occupy the 32 bits of the two removed 16-bit data words.

For the compressed block 50, identifying a single selected word where two other words are close to requires more complexity (e.g., area, latency and power) to subtract all pairs of words in the block. The compressed block 60 targets selected arbitrary words where a predefined set of arbitrary words can be used as a base for delta compression. For example, some embodiments may utilize the first and ninth words in the block as two arbitrary bases. Limiting the number of possible base word positions and/or utilizing fixed positions for the possible base words significantly reduces the area, latency and power needed to compute the deltas because subtractions have to be performed only with a small subset of all word pairs. Utilizing fewer possible base word positions also increases the number of free bits in the metadata, which may then be utilized for other purposes. For example, the 4-bit IS field may be replace with the 1-bit IA flag, which frees up 3-bits of the metadata. The extra bits allow the compressed block 60 to include 11-bit SECDEC ECC (which may cover up to a 64B block), and 4-bit delta values instead of 3-bit (which increases the likelihood of successful compression).

An example implementation of the compressed block 60 may utilize only two arbitrary words (e.g., the first and ninth words) as potential bases in addition to zero. For example, some embodiments may start with zero (0) for the base value and determine if two of the other words are within a 4-bit delta of zero. If so, the compressed flag C is set to 7 (binary 111), the flag F is set to zero to indicate a base value of zero, I1 is set to the position of the first data word within the 4-bit delta of zero, I2 is set to the position of the second data word within the 4-bit delta of zero, and the delta fields D1 and D2 are set to the respective delta values. Otherwise, some embodiments may start with the first word and determine if two of the other words are within a 4-bit delta of the first word. If so, the compressed flag C is set to 7 (binary 111), the flag F is set to one to indicate an arbitrary base value, IA is set to 0 (to indicate the first word provides the base value), I1 is set to the position of the first data word within the 4-bit delta of the first word, I2 is set to the position of the second data word within the 4-bit delta of the first word, and the delta fields D1 and D2 are set to the respective delta values.

If less than two words are within a 4-bit delta of the first word, the process may repeat for the ninth data word to determine if two of the other words are within a 4-bit delta of the ninth word. If so, the compressed flag C is set to 7 (binary 111), the flag F is set to one to indicate an arbitrary base value, IA is set to 1 (to indicate the ninth word provides the base value), I1 is set to the position of the first data word within the 4-bit delta of the ninth word, I2 is set to the position of the second data word within the 4-bit delta of the ninth word, and the delta fields D1 and D2 are set to the respective delta values. Those skilled in the art will appreciate that all or portions of the foregoing process may be implemented with a state machine or combinatorial logic. If any of zero, the first word, or the ninth word provide a suitable base value, the ECC information for the block is stored in the ECC field. Otherwise, the compression flag field may be set to 0, indicating that the compression was unsuccessful and the overflow data may be stored separately from the uncompressed block.

The compressed block 60 advantageously covers SECDED ECC for either a 32B or a 64B block. For 32B, only 10 bits of ECC are needed. For 64B granularity, 11 bits are needed for ECC, which could be stored in either the top or bottom 32B chunk. The 1-bit flag F indicates whether deltas are measured from zero or an arbitrary base, and the 1-bit flag IA identifies the appropriate index for the arbitrary base because there are only two possibilities (e.g., W0 or W8). Advantageously, embodiments provide high compression coverage with less complexity as compared to conventional compression technology (e.g., FECC, BDI, etc.). Over a wide range of benchmarks across several client, server, and HPC workloads, embodiments showed average coverage over 80% when supporting 32B ECC granularity. For 64B granularity, because the block is covered if either the top or bottom chunk can be compressed, average coverage increases to 84%.

The compressed blocks 50 and 60 are non-limiting examples of compression technology in accordance with some embodiments. Given the benefit of the present application, numerous other examples will occur to those skilled in the art. For example, depending on the size of the metadata, more or fewer data words may be removed with corresponding changes to the compression metadata. Similarly, some embodiments may use more or fewer fixed, arbitrary data word positions for the base value. Some embodiments may use more or fewer bits for the delta value.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

As noted above, ECC memory increases cost due to additional DRAM devices and the data lane. For high-end systems, customers have traditionally invested in the extra costs needed to populate special ECC DRAMs compared to regular DRAMs. However, for low-end systems in the internet of things (IoT) domain, cost is a very important parameter. For example, when using Low Power DDR (LPDDR) memory with 16 bit channel width, the cost of adding dedicated devices per channel for ECC protection is prohibitive. Therefore, in order to support low cost and the ECC requirement, in-band ECC mechanisms may be used.

In-band ECC allows for SECDED with much lower capacity overhead and with no pin count increase. Data is protected at a configurable granularity (64 Bytes, 32 Bytes, 16 Bytes, etc.) with 2-bytes of ECC value. Conventionally, a portion of the total DRAM size is reserved to store these ECC data and enabling in-band ECC causes a performance penalty, because each read or write access to memory is translated into an additional request to read or write the ECC data and thus increases the memory bandwidth used. Some embodiments provide technology to reduce the portion of DRAM reserved to store ECC data and reduce the in-band ECC performance penalty by compressing a block with delta compression from select arbitrary bases and storing both the compressed data and ECC (e.g., and/or other metadata) in the same space used for the uncompressed block. Some embodiments may advantageously increase coverage with low complexity compression (e.g., as compared to other compression techniques). Advantageously, embodiments of in-band ECC compression technology may greatly reduce the number of read and write requests that require two accesses to the memory.

In some embodiments, the in-band ECC compression is implemented in a separate module that is placed before the memory controller in a SoC. Having in-band ECC compression functionality in an independent module allows for portability and reuse across different SoCs without changes to existing modules. It also allows for power gating of the whole in-band ECC compression module when ECC protection is not needed.

The in-band ECC compression module improves safety and reliability by providing error check and correction to all or specific regions of the physical memory space. The in-band ECC compression module can be enabled for memory technologies that do not support the out-of-band ECC, where the cost of adding an additional device to each channel for ECC data storage is prohibitive.

In some embodiments, the in-band ECC compression module is placed on the path of memory reads and writes to a DRAM memory controller (or any other type of addressable memory element). The in-band ECC compression module recognizes whether a region should be ECC protected based on the incoming request address. As reading and generation of ECC data adds additional bandwidth overhead, a recent syndrome buffer inside the in-band ECC compression module may be used to reduce this overhead, by storing the recently used ECC data.

Figure 7:
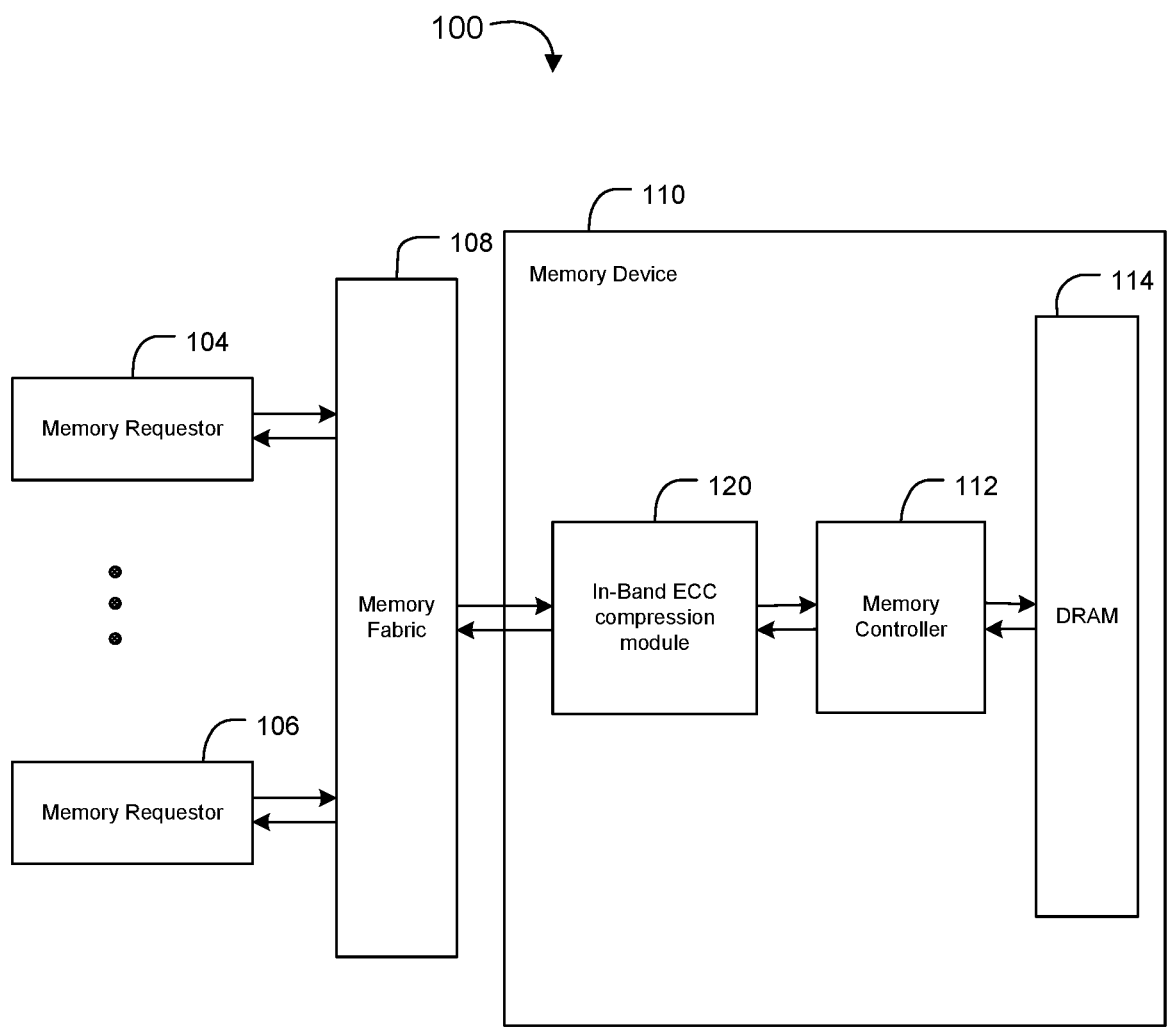
FIG. 7 illustrates a block diagram that shows the placement of an in-band ECC compression module in a memory subsystem according to an embodiment.

FIG. 7 illustrates a block diagram 100 that shows the placement of an in-band ECC compression module 120 in a memory subsystem, in accordance with certain embodiments.

A plurality of memory requestors 104, 106 may transmit input/output (I/O) requests comprising reads and writes via a memory fabric 108 to a memory device 110. The plurality of memory requestors 104, 106 may comprise host computational systems or other devices.

The memory device 110 includes an in-band ECC compression module 120 that incorporates the delta from select arbitrary bases compression technology as described herein (e.g., utilizing the compression block 60, etc.). The in-band ECC compression module 120 is placed in the memory device 110 in a configuration such that the I/O requests are intercepted and processed by the in-band ECC compression module 120 before further processing by a memory controller 112 for accessing the DRAM 114 (other memory besides the DRAM 114 may be used in alterative embodiments). While in FIG. 7 the in-band ECC compression module 120 has been shown as a separate module from the memory controller 112, in certain embodiments, the in-band ECC compression module 120 or its operations may be implemented in the memory controller 112.

In FIG. 7, the in-band ECC compression module 120 sits on the path of memory reads and writes to the memory controller 112, and protects data at a configurable granularity (64B, 32B, 16B, etc.), with a 16-bit SECDED code. The in-band ECC compression module 120 sits on the way to the DRAM memory 114 and when enabled, intercepts all requests to the memory controller 112.

Although the in-band ECC compression module 120 supports ECC protection of all of the memory address space in the DRAM 114, it is expected that only a smaller portion of memory address space needs to be ECC protected, and only critical applications are allocated into that protected space. This reduces the bandwidth overhead of enabling in-band ECC as accesses to unprotected regions do not generate additional requests to read or write the ECC data.

Although various embodiments are described with respect to a dynamic volatile memory such as the DRAM 114, embodiments can be applied to any memory device or devices that propagate values. A memory subsystem as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5), LPDDR5 (LPDDR version 5), HBM2 (HBM version 2), and/or others, and technologies based on derivatives or extensions of such specifications.

In addition to, or alternatively to, volatile memory, in certain embodiments, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a 3D crosspoint memory device, or other byte addressable nonvolatile memory devices. In one embodiment, the memory device can be or include memory devices that use chalcogenide phase change material (e.g., chalcogenide glass), multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, a spintronic magnetic junction memory based device, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

Figure 8:
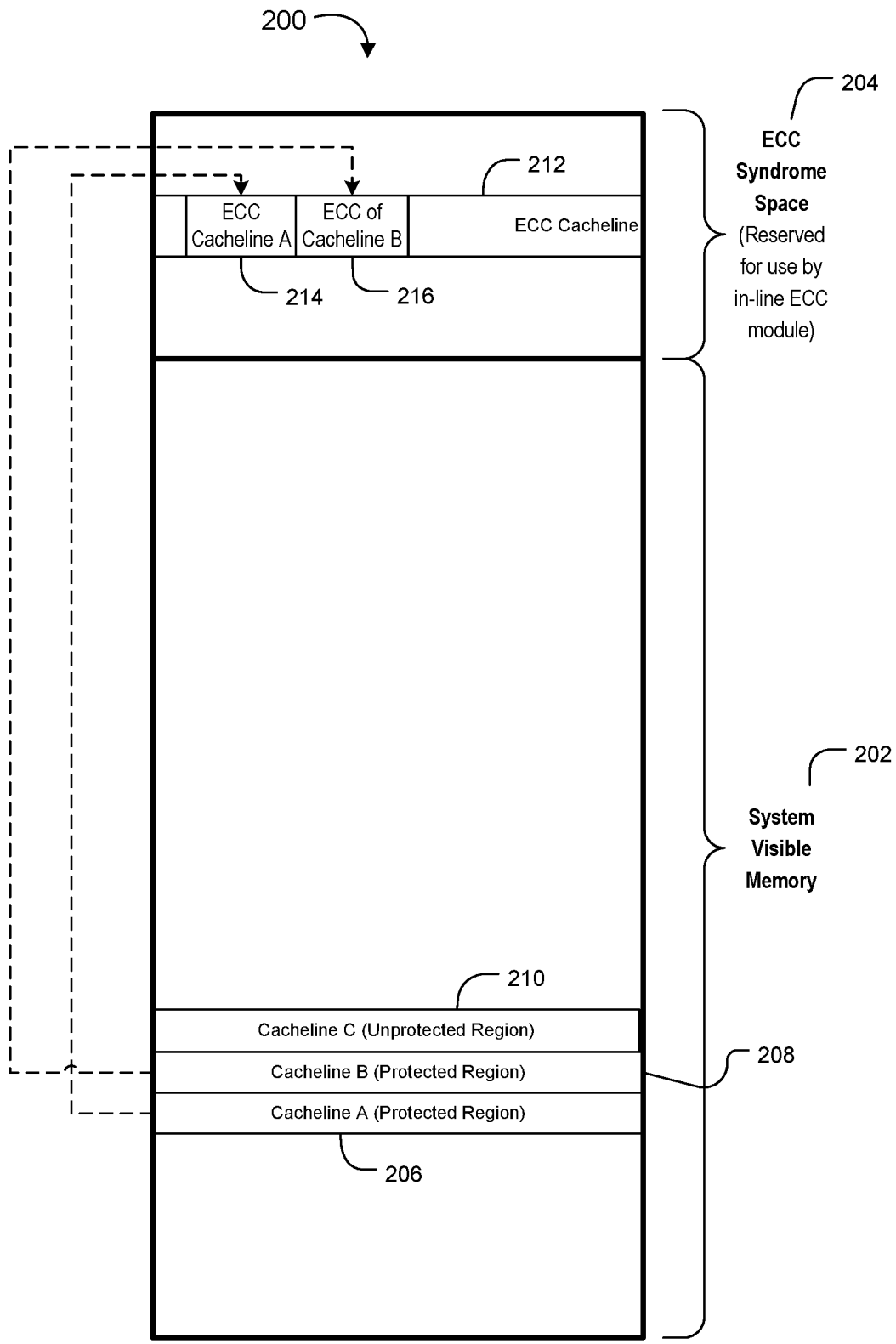
FIG. 8 illustrates a block diagram that shows how the memory space is divided into a system visible memory and an ECC syndrome space according to an embodiment.

FIG. 8 illustrates a block diagram 200 that shows how the addressable memory space corresponding to the DRAM 114 is divided into a system visible memory 202 and an ECC syndrome space 204 that is an ECC data storage region, in accordance with certain embodiments. FIG. 8 also shows how the addressable memory space is divided into protected and non-protected regions in the system visible memory. For example, cacheline A 206 and cacheline B 208 are protected regions whose data needs ECC protection and, if the compression is unsuccessful, the corresponding ECC data is stored in the ECC cacheline 212 in regions 214, 216 respectively, together with any overflow data from the uncompressed block. Cacheline C 210 is an unprotected region whose data does not need ECC protection.

The region for the ECC syndrome space 204 and the region for the system visible memory 202 may be programmed at boot time or may be changed dynamically at runtime. A region of memory that is reserved at boot time for ECC data storage is referred to as the ECC syndrome space 204. The size of this region depends on the compression coverage and the protection granularity. This reserved space 204 is not visible to the rest of the system and may only be used by the in-line ECC compression module 120. Advantageously, some embodiments reduce the amount of memory reserved for the ECC syndrome space 204 because relatively high compression coverage ensures that most ECC data is stored together with the compressed blocks.

If the compression was unsuccessful (e.g., as indicated by the compression flag), the in-line ECC compression module 120 converts a read/write transaction (cache line access) to a protected region of memory into two separate memory requests. One memory request is to the actual data cache line and another to the cache line containing the ECC value and the overflow data. Based on the incoming read/write address, the in-line ECC compression module 120 determines the address of the ECC data corresponding to that cache line by using a simple address calculation.

For example, the in-band ECC compression module 120 intercepts an I/O request sent to the memory device 110 from a memory requestor 104, 106 via the memory fabric 108. The in-band ECC compression module 120 determines whether the data of logical address corresponding the I/O request needs ECC protection. If so, the in-band ECC compression module 120 performs I/O to the both the visible address space (i.e., the system visible memory 202) in the locations where the successfully compressed data is stored and, if needed, to the ECC syndrome space 204 where the ECC data for the uncompressed data is stored.

If the in-band ECC compression module 120 determines that the data of logical address corresponding to the I/O request does not need ECC protection, then the in-band ECC compression module 120 performs I/O to the visible address space (i.e., the system visible memory 202) in the locations where the uncompressed data is stored, but there is no need to perform I/O to the ECC syndrome space 204 as there is no ECC data for the data.

Figure 9:
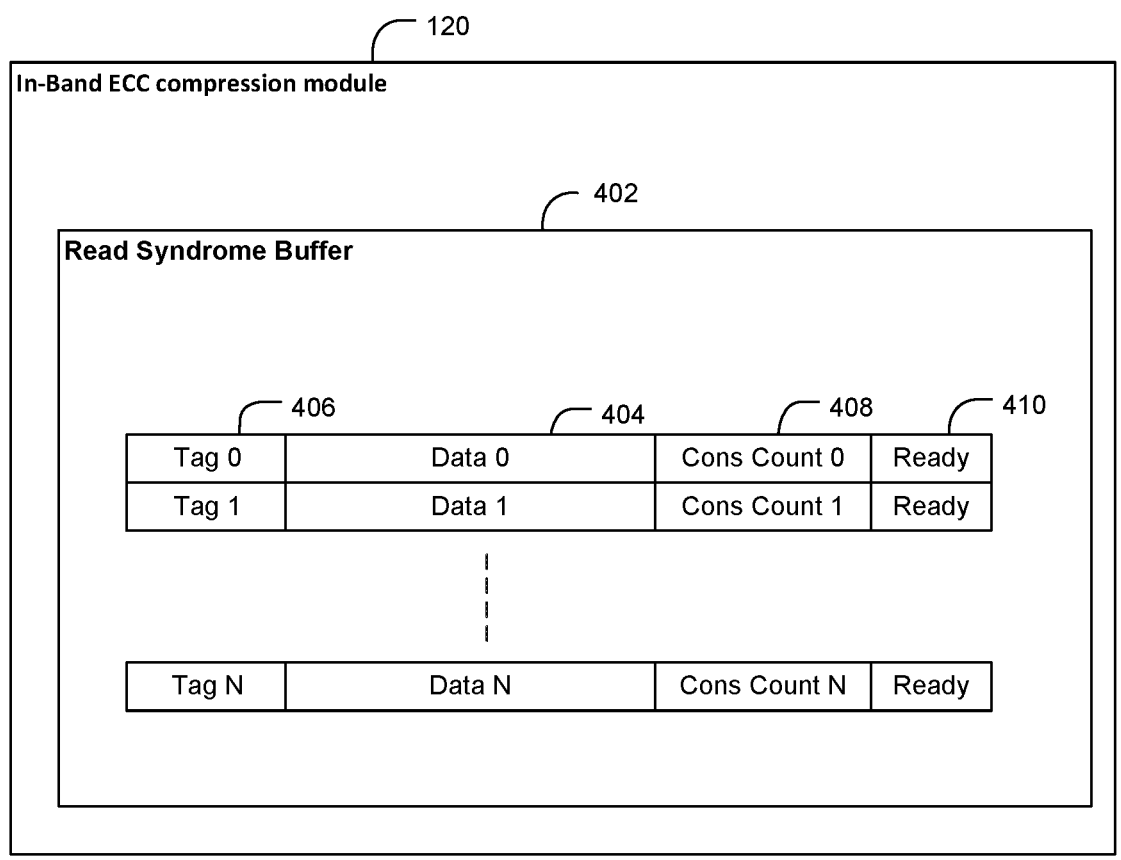
FIG. 9 illustrates a block diagram that shows an in-band ECC compression module with a recent syndrome buffer according to an embodiment.

FIG. 9 illustrates a block diagram that shows an in-band ECC compression module 120 with a recent syndrome buffer 402, in accordance with certain embodiments.

The recent syndrome buffer 402 inside the in-band ECC compression module 120 may be used to further reduce the bandwidth overhead by storing the recently used ECC data and overflow data into an internal structure in the in-band ECC compression module 120 and avoid the additional read request needed to read the data from memory. Because the entirety of an ECC cacheline 212 is read while reading ECC data stored in a region of the ECC cacheline 212, the ECC data for a plurality of protected regions may be stored in the syndrome buffer 404 in anticipation of future read requests being directed to adjacent regions because of locality of reference.

For example, if a read request is for data stored in cacheline A 206, then to read the ECC data 214 and overflow data of cacheline A 206, the entirety of the ECC cacheline 212 is read, and the ECC data 216 and overflow data of cacheline B 208 is also read. The ECC data 216 and overflow data of cacheline B 208 is stored in recent syndrome buffer 402 in anticipation of future read requests being directed to data stored in cacheline B 208.

Because a single ECC cacheline contains ECC and overflow data for 32, 16 or 8 other data lines (based on ECC protection granularity) and given that most benchmarks exhibit temporal/spatial locality, a lot of times the same ECC cache line may be re-fetched from DRAM which would significantly increase the overall DRAM bandwidth.

The read syndrome buffer 402 is a fully associative structure that contains four main fields. The DATA field 404 which holds a 64 Byte Cache Line, the tag field 406, the Consumer Count field 408 which indicates how many consumers are waiting for this DATA field from the requestor, and finally the Ready field 410 per which indicates whether the data is present in the read syndrome buffer 402 or is in transit from memory.

The in-line ECC module DATA segment may have one read and one write port. The read port may be utilized by the consumer to read data out of the DATA region and the write port may be used to store returning data into the read syndrome buffer 402. The tag look up may have just one port for address match and it may have one of the following responses: HIT indication along with the entry location and the Ready bit or MISS indication with allocation and corresponding entry location in the read syndrome buffer 402. The consumer count field 408 is decremented whenever a DATA port read occurs to the corresponding entry and it is incremented whenever a HIT occurs to that entry.

The Ready field 410 indicates whether the data is available in the read syndrome buffer 402 or whether the data is in the process of being fetched from DRAM. For every ECC protected read, once the address of ECC meta-data read is generated, it looks up the read syndrome buffer tags 406 to find if the cache line it is trying to access already exists in the read syndrome buffer 402.

In certain embodiments, writes are not to be cached in the read syndrome buffer 402. The writes invalidate a line in read syndrome buffer 402 if they hit on it. However, the read syndrome buffer 402 may also be implemented as a cache that is accessed by both reads and writes.

Figure 10:
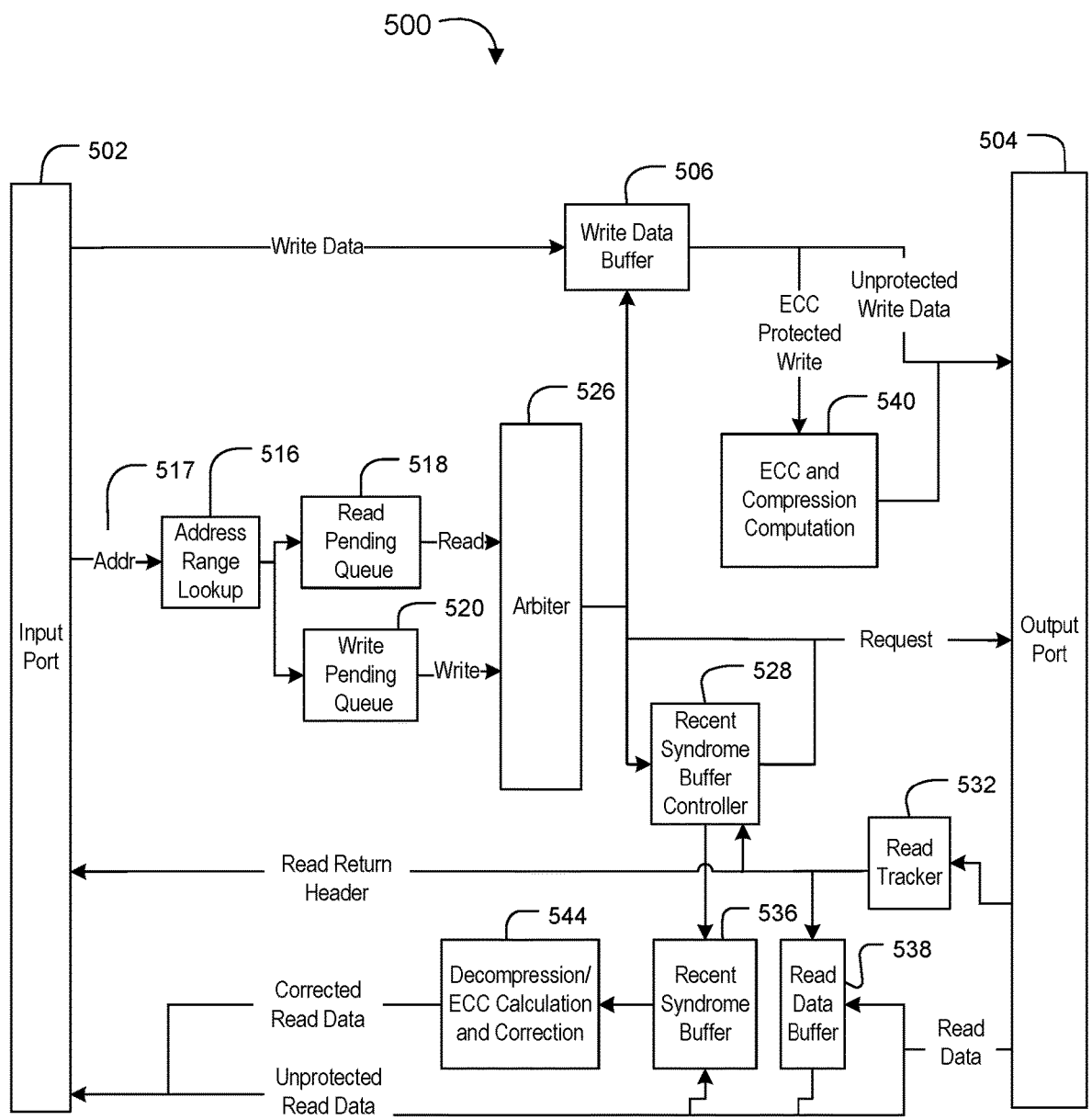
FIG. 10 is a block diagram of another example of an electronic memory system according to an embodiment.

FIG. 10 illustrates a block diagram 500 that shows elements in the in-band ECC compression module 120 and operations performed within the in-band ECC compression module 120, in accordance with certain embodiments. The in-band ECC compression module 120 behaves as both a memory requestor and responder on the path to the addressable memory.

The in-band ECC compression module 120 is comprised of an input port 502, and output port 504, a write data buffer 506, an ECC and compression computation unit 540, an address range lookup 516, a read pending queue 518, a write pending queue 520, an arbiter 526, a recent syndrome buffer controller 528, a read tracker 532, a read data buffer 538, a recent syndrome buffer 536 (corresponding to recent syndrome buffer 402) and a decompression/ECC calculation and correction unit 544.

All reads and writes entering the in-band ECC compression module 120 via the input port 502 go through an ECC address lookup 516 that first determines whether the given transaction is an ECC protected access, based on its address 517. Hazard checks are performed and a determination is made of the queue to send the read or write to.

The in-band ECC compression module 120 maintains two separate queues 518, 520 for reads and writes. The queues are combined across ECC and non-ECC traffic. Each queue entry in all the queues holds information for the data request; the ECC transaction is generated after the request wins the arbitration. The queues also maintain additional metadata to indicate whether the request is an ECC-protected transaction, whether it is currently blocked due to a dependency on another transaction, and other metadata fields to enable scheduling.

Each of the queues presents the oldest, non-blocked transaction to the main in-band ECC module arbiter 526. The in-band ECC compression module 120 arbiter 526 then selects one request at a time based on an arbitration policy.

For each inflight ECC-protected read transaction, if the data is uncompressed, the in-band ECC compression module 120 tracks completion of two independent reads: the data read and the ECC/overflow read. The ECC detection and correction operations 544 can be performed only after the data for both read transactions are returned. Moreover, the in-band ECC compression module 120 assigns a new request tag to each protected read or write request. The ECC read tracker 532 holds the original read request's tag and tracks the completion of the two associated read requests.

The read data buffer 538 consists of separate storage for ECC protected read transactions and unprotected return data.

The recent syndrome buffer 536 stores the most recent accessed ECC data. Each entry in recent syndrome buffer 525 holds the ECC data for 32, 16 or 8 cachelines based on configured protection granularity.

After the request enters the in-band ECC compression module 120, the address of that transaction is compared against the protected address ranges to determine whether that request is to an ECC-protected or non-protected region. The request is then allocated into one of the pending request queues.

Each of the queues presents the oldest, non-blocked transaction to the main in-band ECC compression module 120 scheduler. The in-band ECC compression module 120 then employs an arbiter 526 that schedules at a "transaction" level. For ECC-protected traffic, a transaction for compressed data consists of a single read/write, while a transaction for uncompressed data consists of two reads/writes; for unprotected traffic a transaction consists of a single read/write. The ECC transaction, if needed, is generated after the requests are selected by the arbiter.

The ECC data request address is computed as a function of the incoming address pointing to the ECC data storage region.

After a winner transaction is selected, the in-band ECC compression module 120 scheduler ensures that it is atomically issued. This essentially means that if an ECC-protected transaction for uncompressed data is selected, then both of the reads/writes to data and the ECC are issued back-to-back, and no other intervening read/write from another transaction can be issued.

Read data buffer (RDB) 538 is the temporary storage for all in-flight protected data and their ECC values. Before sending the request, the in-band ECC compression module 120 may ensure that there are pre-assigned data return slots in the read data return buffer for returning the data and its ECC data. For unprotected traffic, there are dedicated first in first out (FIFO) data structures.

The ECC read data tracker 532 structure operates in lockstep with the recent syndrome buffer 536 and keeps the header information for the original request, as well as tracking details of when the data is returned and ready to be consumed.

Every request entering the in-band ECC compression module 120 goes through an ECC address lookup to determine whether it is a protected transaction. There can be many types of requests, based on whether it is protected/unprotected and read/full write/partial write.

An unprotected read entering the in-band ECC compression module 120 is directed to the Read Pending Queue 518, which supports scheduling based on the age. The read address is checked against the Write Pending Queue 520 to see if there are any dependencies with writes waiting in the queue. If there is a match, the newer write is blocked in the queue until all previous writes to the same address are scheduled. When the read's data returns from the memory controller, the in-band ECC compression module 120 checks the tag information to determine whether the data is for protected traffic or unprotected traffic. In the case of unprotected read, the read data bypasses the ECC check engine and is sent to the original requestor.

An unprotected full write transaction entering the in-band ECC compression module 120 is directed to the Write Pending Queue 520 that supports scheduling based on age. The write checks the address against other entries in the queue to see if it has any dependencies with older writes and reads to the same address and gets blocked until the dependency is resolved. For an unprotected write and partial write, in-band ECC compression module 120 just behaves as a forwarding agent with no ECC generation needed.

Similar to unprotected read, on allocation, the protected read transaction looks up the Write Pending Queue 520 to find all of the transactions (data/ECC pairs) it is blocked on. For protected, uncompressed data, the protected reads remain blocked until they see both the data and the ECC request to that address go out from the scheduler. Once the read request wins the arbitration, it checks the recent syndrome buffer 536 to see whether the ECC data for that request already exists. On a miss, a new entry is allocated in the recent syndrome buffer 536 when the buffer is not full, or if the recent syndrome buffer is full, one of the entries in the recent syndrome buffer 536 with no waiting consumers will be deallocated and the new entry will be allocated in that location. The entry number is stored in the Read Tracker 532. At the same time ECC data transaction is generated in parallel and is sent immediately after the read data request. On a hit, the recent syndrome buffer controller 528 increments the consumer counter of the entry and also returns the entry number in the recent syndrome buffer 536 where it is stored. This entry number will be stored in the ECC Read Tracker 532 and will be utilized when the corresponding data is present in the recent syndrome buffer 536. In this case the ECC data transaction is not generated since the recent syndrome buffer will have the data ready.

On the return path for protected, uncompressed data, in-band ECC compression module 120 waits for both the data access and ECC access (if not present in the recent syndrome buffer) to return before performing the ECC detection/correction operations. The readiness of the needed ECC data will be tracked by the read tracker. The in-band ECC compression module 120 needs to ensure that there are slots in the Read data buffer/Read tracker structure where the returning transactions can be held before it can be issued to ECC logic. To solve this issue, the in-band ECC compression module 120 pre-allocates the entry in the tracker at the point of scheduling. When a protected read data returns, the in-band ECC compression module 120 can identify at which location in the read data buffer 538 it should be written. When the ECC data returns to the in-band ECC compression module 120 recent syndrome buffer 536, the entry number will be broadcast to all the waiting consumers in the read tracker and it will check whether it is equal to the entry it is waiting for and therefore be able to track when the ECC data has arrived and is ready for consumption from the recent syndrome buffer 536. Once both accesses are in read data buffer 538 and recent syndrome buffer 536, the in-band ECC compression module 120 schedules the request to the ECC calculation and correction logic 534. The corrected data is then placed in the appropriate First In First Out (FIFO) queue and sent to the requestor.

When a protected write transaction enters the in-band ECC compression module 120, the request information is allocated in the Write Pending Queue, and the data is stored in Write Data Buffer. The ECC request address, value, and byte enables for a protected write are not stored but are generated on the fly, when the transaction is scheduled. In-band ECC compression module 120 needs to ensure Write after Write and Write after Read ordering as well as invalidation of the corresponding ECC data in recent syndrome buffer 536 if present. To ensure this, an incoming write request checks against all of the reads in the pending queues, all of the outstanding reads waiting in the tracker/read data buffer, all of the writes in the Write Pending Queue and valid entries in recent syndrome buffer.

A protected partial write transaction in the in-band ECC compression module 120 is essentially composed of two protected transactions: A protected underfill read transaction and a protected full write transaction. The hazard management is the same as the full write case. Note, however, that the underfill read transaction cannot be issued without all of the hazards and dependencies clearing. The in-band ECC compression module 120 scheduler needs to be aware that it is issuing an underfill read, and the tracker/read data buffer structures need to set the underfill field, as well as indicate which entry in the write queue is the recipient of the underfill read. Once the underfill read is complete, the corrected data is directed back to the Write Data Buffer, where it is merged with the partial data. After this point, the Write Pending Queue will now present a protected full write to the in-band ECC compression module 120 scheduler.

The error detection and correction is done by adding 16 bits on every 512, 256 or 128 data bits that are written to memory (based on protection granularity configuration). The creation of the each ECC bit is done by XOR-ing a certain combination of the written bits according to a hamming matrix. When reading the data, 16-bit syndrome are created by XOR-ing each ECC bit with the same bits that originally created them.

The syndrome analysis shows the error, if it is correctable, and how to correct it.

The in-band ECC compression module 120 needs to identify ECC errors and report them. The in-band ECC compression module 120 may generate an error message to a collector module whenever an ECC error occurs. The error message indicates whether the error is correctable or uncorrectable error and system software may then investigate the corresponding Error Log Registers to find out more details about the error.

Additional Notes and Examples

Example 1 includes an electronic apparatus, comprising a substrate, and logic coupled to the substrate, the logic to determine a base value to compress a block of data, wherein the block of data consists of a first number of data words, replace original values from a second number of data words from the block of data with respective delta values from the base value to provide compressed data, wherein the second number of data words is at least two less than the first number of data words, and store metadata associated with the block of data together with the compressed data in the block of data.

Example 2 includes the apparatus of claim 1, wherein the logic is further to set one or more data index fields in the metadata to indicate respective positions of data words of the block of data that are replaced with the respective delta values from the base value.

Example 3 includes the apparatus of any of claims 1 to 2, wherein the logic is further to identify a data word from the block of data with a data value that is suitable for the base value, and set the base value to the data value of the identified data word.

Example 4 includes the apparatus of claim 3, wherein the logic is further to set a base index field in the metadata to indicate a position of the identified data word.

Example 5 includes the apparatus of any of claims 1 to 4, wherein the logic is further to set the base value to a data value at a fixed data word position.

Example 6 includes the apparatus of claim 5, wherein the logic is further to set a field in the metadata to indicate if the base value is zero or the data value at the fixed data word position.

Example 7 includes the apparatus of any of claims 1 to 6, wherein the metadata includes error correction code information.

Example 8 includes an electronic memory system, comprising a controller, memory to store a block of data that consists of a first number of data words, and logic communicatively coupled to the controller and the memory, the logic to determine a base value to compress the block of data, replace original values from a second number of data words from the block of data with respective delta values from the base value to provide compressed data, wherein the second number of data words is at least two less than the first number of data words, and store metadata associated with the block of data together with the compressed data in the block of data.

Example 9 includes the system of claim 8, wherein the logic is further to set one or more data index fields in the metadata to indicate respective positions of data words of the block of data that are replaced with the respective delta values from the base value.

Example 10 includes the system of any of claims 8 to 9, wherein the logic is further to identify a data word from the block of data with a data value that is suitable for the base value, and set the base value to the data value of the identified data word.

Example 11 includes the system of claim 10, wherein the logic is further to set a base index field in the metadata to indicate a position of the identified data word.

Example 12 includes the system of any of claims 8 to 11, wherein the logic is further to set the base value to a data value at a fixed data word position.

Example 13 includes the system of claim 12, wherein the logic is further to set a field in the metadata to indicate if the base value is zero or the data value at the fixed data word position.

Example 14 includes the system of any of claims 8 to 13, wherein the metadata includes error correction code information.

Example 15 includes a method of compressing memory, comprising determining a base value to compress a block of data, wherein the block of data consists of a first number of data words, replacing original values from a second number of data words from the block of data with respective delta values from the base value to provide compressed data, wherein the second number of data words is at least two less than the first number of data words, and storing metadata associated with the block of data together with the compressed data in the block of data.

Example 16 includes the method of claim 15, further comprising setting one or more data index fields in the metadata to indicate respective positions of data words of the block of data that are replaced with the respective delta values from the base value.

Example 17 includes the method of any of claims 15 to 16, further comprising identifying a data word from the block of data with a data value that is suitable for the base value, and setting the base value to the data value of the identified data word.

Example 18 includes the method of claim 17, further comprising setting a base index field in the metadata to indicate a position of the identified data word.

Example 19 includes the method of any of claims 15 to 18, further comprising setting the base value to a data value at a fixed data word position.

Example 20 includes the method of claim 19, further comprising setting a field in the metadata to indicate if the base value is zero or the data value at the fixed data word position.

Example 21 includes the method of any of claims 15 to 20, wherein the metadata includes error correction code information.

Example 22 includes at least one non-transitory machine readable medium comprising a plurality of instructions that, in response to being executed on a computing device, cause the computing device to determine a base value to compress a block of data, wherein the block of data consists of a first number of data words, replace original values from a second number of data words from the block of data with respective delta values from the base value to provide compressed data, wherein the second number of data words is at least two less than the first number of data words, and store metadata associated with the block of data together with the compressed data in the block of data.

Example 23 includes the at least one non-transitory machine readable medium of claim 22, comprising a plurality of further instructions that, in response to being executed on the computing device, cause the computing device to set one or more data index fields in the metadata to indicate respective positions of data words of the block of data that are replaced with the respective delta values from the base value.

Example 24 includes the at least one non-transitory machine readable medium of any of claims 22 to 23, comprising a plurality of further instructions that, in response to being executed on the computing device, cause the computing device to identify a data word from the block of data with a data value that is suitable for the base value, and set the base value to the data value of the identified data word.

Example 25 includes the at least one non-transitory machine readable medium of claim 24, comprising a plurality of further instructions that, in response to being executed on the computing device, cause the computing device to set a base index field in the metadata to indicate a position of the identified data word.

Example 26 includes the at least one non-transitory machine readable medium of any of claims 22 to 25, comprising a plurality of further instructions that, in response to being executed on the computing device, cause the computing device to set the base value to a data value at a fixed data word position.

Example 27 includes the at least one non-transitory machine readable medium of claim 26, comprising a plurality of further instructions that, in response to being executed on the computing device, cause the computing device to set a field in the metadata to indicate if the base value is zero or the data value at the fixed data word position.

Example 28 includes the at least one non-transitory machine readable medium of any of claims 22 to 27, wherein the metadata includes error correction code information.

Example 29 includes a memory compression apparatus, comprising means for determining a base value to compress a block of data, wherein the block of data consists of a first number of data words, means for replacing original values from a second number of data words from the block of data with respective delta values from the base value to provide compressed data, wherein the second number of data words is at least two less than the first number of data words, and means for storing metadata associated with the block of data together with the compressed data in the block of data.

Example 30 includes the apparatus of claim 29, further comprising means for setting one or more data index fields in the metadata to indicate respective positions of data words of the block of data that are replaced with the respective delta values from the base value.

Example 31 includes the apparatus of any of claims 29 to 30, further comprising means for identifying a data word from the block of data with a data value that is suitable for the base value, and means for setting the base value to the data value of the identified data word.

Example 32 includes the apparatus of claim 31, further comprising means for setting a base index field in the metadata to indicate a position of the identified data word.

Example 33 includes the apparatus of any of claims 29 to 32, further comprising means for setting the base value to a data value at a fixed data word position.

Example 34 includes the apparatus of claim 33, further comprising means for setting a field in the metadata to indicate if the base value is zero or the data value at the fixed data word position.

Example 35 includes the apparatus of any of claims 29 to 34, wherein the metadata includes error correction code information.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds, costs, and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
   a substrate; and
   logic coupled to the substrate, the logic to:
   determine a base value of a first block of data, wherein the first block of data consists of a first number of data words which comprise a first data word and a second data word;
   perform a compression of the first block of data to determine:
   a second number of data words based on the first number of data words, wherein the second number of data words is at least two less than the first number of data words; and
   two words of metadata which is to comprise:
   a compression flag value which identifies whether the compression was successful;
   a first index value which indicates a first position of the first data word;
   a first delta value from the base value, the first delta value corresponding to the first data word;
   a second index value which indicates a second position of the second data word;
   a second delta value from the base value, the second delta value corresponding to the second data word;
   a third index value which indicates a position of the base value; and a base flag value which identifies whether the base value is zero; and store the two words of metadata with the second number of data words as a compressed block.

2. The electronic apparatus of claim 1, wherein the two words of metadata are further to comprise a base flag value which identifies whether the base value is zero.

3. The electronic apparatus of claim 1, wherein the two words of metadata are further to comprise error correction information.

4. The electronic apparatus of claim 3, wherein:
the first index value, the second index value, and the third index value are each to consist of a respective four bits;
the first delta value, and the second delta value are each to consist of a respective three bits; and
the error correction information is to consist of ten bits.

5. The electronic apparatus of claim 3, wherein
the first index value, and the second index value are each to consist of a respective four bits;
the third index value is to consist of one bit;
the first delta value, and the second delta value are each to consist of a respective three bits; and
the error correction information is to consist of eleven bits.

6. The electronic apparatus of claim 1, wherein the logic to: store the two words of metadata with the second number of data words as the compressed block comprises the logic to replace the first block of data with the compressed block.

7. The electronic apparatus of claim 1, wherein the compression flag value comprises three bits.

8. An electronic memory system, comprising:
a controller;
memory to store a first block of data that consists of a first number of data words which comprise a first data word and a second data word; and
logic communicatively coupled to the controller and the memory, the logic to:
determine a base value of the first block of data;
perform a compression of the first block of data to determine:
a second number of data words based on the first number of data words, wherein the second number of data words is at least two less than the first number of data words;
two words of metadata which is to comprise:
a compression flag value which identifies whether the compression was successful;
a first index value which indicates a first position of the first data word;
a first delta value from the base value, the first delta value corresponding to the first data word;
a second index value which indicates a second position of the second data word;
a second delta value from the base value, the second delta value corresponding to the second data word;
a third index value which indicates a position of the base value; and
a base flag value which identifies whether the base value is zero; and
store the two words of metadata with the second number of data words as a compressed block.

9. The electronic memory system of claim 8, wherein the two words of metadata are further to comprise a base flag value which identifies whether the base value is zero.

10. The electronic memory system of claim 8, wherein the two words of metadata are further to comprise error correction information.

11. The electronic memory system of claim 10, wherein:
the first index value, the second index value, and the third index value are each to consist of a respective four bits;
the first delta value, and the second delta value are each to consist of a respective three bits; and
the error correction information is to consist of ten bits.

12. The electronic memory system of claim 10, wherein:
the first index value, and the second index value are each to consist of a respective four bits;
the third index value is to consist of one bit;
the first delta value, and the second delta value are each to consist of a respective three bits; and
the error correction information is to consist of eleven bits.

13. The electronic memory system of claim 8, wherein the logic to: store the two words of metadata with the second number of data words as the compressed block comprises the logic to replace the first block of data with the compressed block.

14. The electronic memory system of claim 8, wherein the compression flag value comprises three bits.

15. A method of compressing memory, the method comprising:
determining a base value of a first block of data, wherein the first block of data consists of a first number of data words which comprise a first data word and a second data word;
performing a compression of the first block of data to determine:
a second number of data words based on the first number of data words, wherein the second number of data words is at least two less than the first number of data words; and
two words of metadata which comprise:
a compression flag value which identifies whether the compression was successful;
a first index value which indicates a first position of the first data word;
a first delta value from the base value, the first delta value corresponding to the first data word;
a second index value which indicates a second position of the second data word;
a second delta value from the base value, the second delta value corresponding to the second data word;
a third index value which indicates a position of the base value; and
a base flag value which identifies whether the base value is zero; and
storing the two words of metadata with the second number of data words as a compressed block.

16. The method of claim 15, wherein the two words of metadata further comprise a base flag value which identifies whether the base value is zero.

17. The method of claim 15, wherein the two words of metadata further comprise error correction information.

18. The method of claim 17, wherein:
the first index value, the second index value, and the third index value each consist of a respective four bits;
the first delta value, and the second delta value each consist of a respective three bits; and
the error correction information consists of ten bits.

19. The method of claim 17, wherein:
the first index value, and the second index value each consist of a respective four bits;
the third index value consists of one bit;
the first delta value, and the second delta value each consist of a respective three bits; and
the error correction information consists of eleven bits.

20. The method of claim 19, wherein the compression flag value comprises three bits.

* * * * *